United States Patent [19]

Takasaki et al.

[11] Patent Number: 4,581,622
[45] Date of Patent: Apr. 8, 1986

[54] UV ERASABLE EPROM WITH UV TRANSPARENT SILICON OXYNITRIDE COATING

[75] Inventors: Kanetake Takasaki, Tokyo; Mikio Takagi, Kawasaki; Kenji Koyama, Yokosuka, all of Japan

[73] Assignee: Fujitsu Limited, Kawasaki, Japan

[21] Appl. No.: 578,992

[22] Filed: Feb. 13, 1984

Related U.S. Application Data

[63] Continuation of Ser. No. 186,666, Sep. 12, 1980, abandoned.

[30] Foreign Application Priority Data

Sep. 14, 1979 [JP] Japan ................................ 54-118278

[51] Int. Cl.[4] ...................... G11C 11/40; H01L 27/10; H01L 27/14; H01L 21/94
[52] U.S. Cl. .................... 357/23.5; 357/30; 357/52; 357/54; 365/185; 427/94; 148/DIG. 114; 148/DIG. 43; 148/DIG. 81
[58] Field of Search .................. 357/23.5, 52, 54, 30; 365/185

[56] References Cited

U.S. PATENT DOCUMENTS

| 3,629,088 | 12/1971 | Frank et al. | 357/54 |
| 3,652,324 | 3/1972 | Chu et al. | 357/54 |
| 4,091,406 | 5/1978 | Lewis | 357/54 |
| 4,229,755 | 10/1980 | Custode | 357/23 VT |
| 4,253,881 | 3/1981 | Hezel | 357/30 |
| 4,257,832 | 3/1981 | Schwabe et al. | 357/23 VT |

OTHER PUBLICATIONS

Scheibe et al, IEEE Trans. on Electron Dev., vol. ED24, No. 5, May 1977, pp. 600–606.

Primary Examiner—William D. Larkins
Attorney, Agent, or Firm—Staas & Halsey

[57] ABSTRACT

A silicon nitride film containing from 20 to 70% oxygen, for use as a surface passivation film, has enhanced ultraviolet ray transmissivity while exhibiting the desirable moisture proofness quality of a silicon nitride film.

8 Claims, 3 Drawing Figures of an EPROM element according to an example of the present invention;

UV ERASABLE EPROM WITH UV TRANSPARENT SILICON OXYNITRIDE COATING

This application is a continuation of application Ser. No. 186,666, filed Sept. 12, 1980, now abandoned.

FIELD OF THE INVENTION

The present invention relates to a semiconductor device in which active and passive elements are formed on a semiconductor substrate, for example, an ultraviolet-erasable, electrically alterable read-only memory (hereinafter referred to as EPROM) device, and more particularly, to a semiconductor device wherein the semiconductor substrate is covered by an insulating film, as well as a process for producing the same.

BACKGROUND OF THE INVENTION

It is known that a semiconductor device, for example, an EPROM device, has a surface passivation film, usually consisting of a phosphosilicate glass (PSG), on the uppermost surface of the EPROM device in order to protect the EPROM device from alkaline ions and moisture. On the other hand, a silicon nitride ($Si_3N_4$) film formed by a plasma vapor phase growth method is finding use as a surface passivation film for semiconductor elements, because silicon nitride is superior in moisture proofness to PSG. However, the silicon nitride has an absorption edge at a wave length of about 2800 Å, which causes the silicon nitride to be impermeable to ultraviolet rays. Accordingly, the silicon nitride film is not usable as a surface passivation film for an EPROM device whose memory is to be erased by ultraviolet rays having a central wave length of 2537 Å.

SUMMARY OF THE INVENTION

An object of the present invention is to provide a semiconductor device having a silicon nitride film which is permeable to ultraviolet rays whle exhibiting excellent moisture proofness.

Another object of the present invention is to provide a process for producing a semiconductor device having on its surface a silicon nitride film permeable to ultraviolet rays.

The present invention relates to a semiconductor device comprising:

a semiconductor substrate;

at least one active and/or passive element formed on or in said semicondutor substrate;

a first insulating film located on said semiconductor substrate;

electrodes of said at least one element; and;

a second insulating film covering said at least one element, said first insulating film and said electrodes, and consisting of an oxynitride, the oxygen atom percentage of which oxynitride, based on the total of the oxygen and nitrogen atoms of said oxynitride, is in the range of from 20 to 70%.

The present invention also relates to a process for producing a semiconductor device, which comprises forming an oxygen-containing silicon nitride film by a plasma chemical vapor deposition method in which monosilane is used as a feed gas, ammonia ($NH_3$) is used as a source of nitrogen and nitrous oxide ($N_2O$) is used as a source of oxygen, and wherein the ratio of $N_2O$ to $NH_3+N_2O$ is in the range of from 0.1 to 0.5.

DETAILED DESCRIPTION OF THE INVENTION

Figure 1:
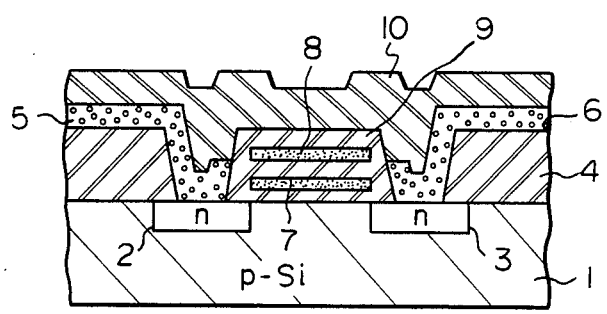
FIG. 1 is a cross-sectional view of the memory cell part of an EPROM element according to an example of the present invention.

Referring to FIG. 1, there is shown a cross-sectional view of the memory cell part of an EPROM element. A p-type silicon semiconductor substrate is represented at 1 and $N^+$-type source and drain regions are represented at 2 and 3, respectively, which regions are formed on the surface of the silicon semicondcutor substrate 1. A field insulating film (first insulating film) 4 consisting of silicon oxide($SiO_2$) isolates individual EPROM elements (memory cells) from each other.

Source and drain leading electrodes 5 and 6, which are made of aluminum, are in ohmic contact with the source region 2 and the drain region 3, respectively. A floating gate 7 consisting of polycrystalline silicon and a control gate 8 consisting of polycrystalline silicon are embedded within an insulating film (first insulating film) 9. A surface passivation film (second insulating film) 10 is provided on the surface of the EPROM device.

The above-mentioned structure of the memory cell of an EPROM device is known. When information memorized, or stored, in the EPROM device is to be erased, the EPROM device is subjected to irradiation by ultraviolet rays through the surface passivation film 10 to discharge the electrical charge stored in the floating gate 8 toward the substrate 1. As the surface passivation film 10, PSG has been mainly used heretofore. The PSG is a glass consisting mainly of $SiO_2$ and having phosphorus added thereto. The PSG is highly hygroscopic.

On the other hand, a silicon nitride ($Si_3N_4$) film is not hygroscopic and is excellent as a surface passivation film. As stated above, however, the silicon nitride is disadvantageous in that it is impermeable to ultraviolet rays. For this reason, the silicon nitride film cannot be used as a surface passivation film for the EPROM device.

The inventors have attempted to develop a silicon nitride film exhibiting excellent moisture proofness and yet having permeability to ultraviolet rays, as used to erase information memorized in the EPROM device, which silicon nitride film can thus be utilized as a passivation film for an EPROM device. As a result, the inventors have found that silicon nitride containing oxygen, that is, so-called silicon oxynitride (SiON), is effective for such a purpose since the silicon oxynitride is permeable to ultraviolet rays which are used to erase information memorized in the EPROM device.

The inventors have also found that if the percentage of the oxygen atoms, based on the sum of the nitrogen atoms and oxygen atoms in the silicon oxynitride, is in a range of from 20 to 70, and preferably from 20 to 50 (this percentage is hereinafter referred to simply as the oxygen concentration), the resultant silicon oxynitride film exhibits moisture proofness almost equal to that of a silicon nitride film yet undergoes no cracking as in the case of the silicon nitride film. Generally, the oxygen-containing silicon oxynitride film has a thickness of from 0.5 to 1.5 microns.

One example of an EPROM device to which the silicon oxynitride film of the present invention is applicable is illustrated in FIG. 1. However, it is to be understood that the silicon oxynitride film of the present invention is applicable also as the surface passivation film for semiconductor devices other than an EPROM device, such as a charge coupled device, a photo transistor or a photo diode, and as an insulating film between layers of a multi-wiring layer structure.

The silicon oxynitride film may be formed by any suitable method selected from a chemical vapor deposition (CVD) method using plasma excitation, a reactive sputtering method, an atmospheric CVD method and a reduced pressure CVD method.

The present invention will now be illustrated by explaining the formation of the silicon oxynitride film by the plasma CVD method.

Figure 2:
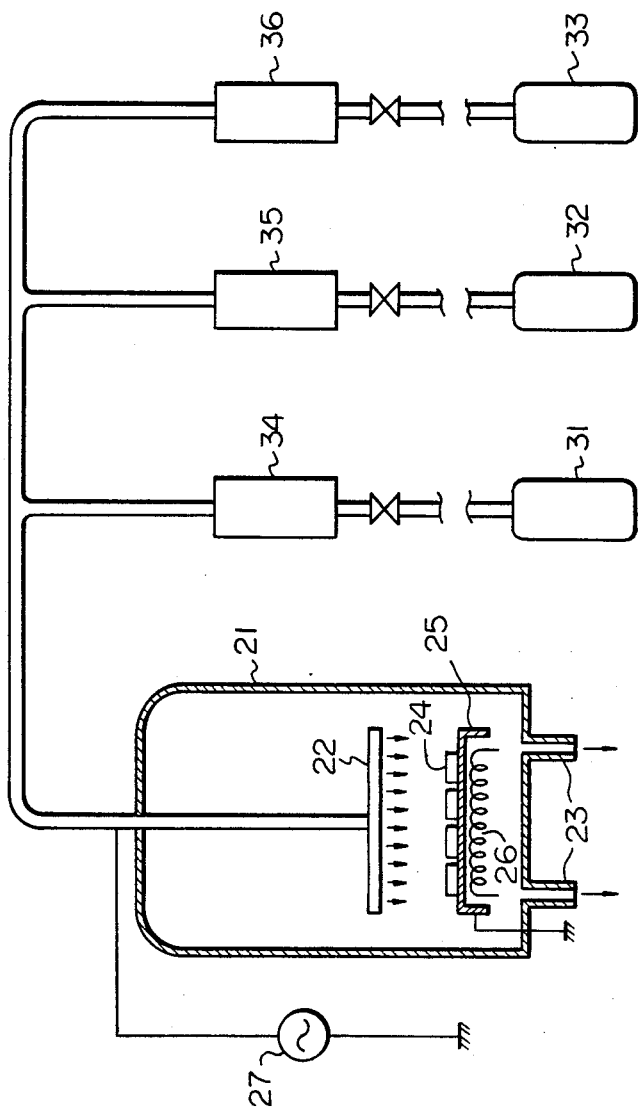
FIG. 2 is a diagrammatic view of an apparatus by which a silicon oxynitride film is formed by a plasma chemical vapor deposition method.

Referring to FIG. 2, there is shown a diagrammatic view of an apparatus by which a silicon oxynitride film is formed on the surface of a silicon substrate by the plasma CVD method. The plasuma CVD apparatus comprises a bell jar type reactive chamber 21 made of quartz and an electrode 22 having a number of holes for discharging a gas. The electrode 22 communicates with a container 31 containing monosilane ($SiH_4$), a container 32 containing ammonia ($NH_3$) and a container 33 containing nitrous oxide ($N_2O$) through flow controllers 34, 35 and 36, respectively. The reactive chamber 21 has exhaust ports 23 at the bottom thereof. A plurality of silicon substrates 24 are placed on a base 25, which also serves as an electrode, and are heated by means of a heater 26 provided below the base 25. A high frequency power supply is denoted at 27.

In operation, the reactive chamber is evacuated until the pressure therein reaches $5 \times 10^{-3}$ Torr. Then, a gaseous mixture consisting of monosilane ($SiH_4$), ammonia ($NH_3$) or nitrogen ($N_2$) and nitrous oxide ($N_2O$) is introduced into the reactive chamber 21. The temperature within the reactive chamber is maintained at 350° C. by means of the heater 26. A high frequency signal (frequency: 13.56 MHz; power: 10 W corresponding to 0.1 w/cm² of the electrode surface) is applied between the electrode 22 and the base 25 by means of the high frequency power supply 27. The pressure within the reactive chamber may vary within the range of from 0.3 to 2.0 Torr. Also, the temperature within the reactive chamber may vary within the range of from 250° to 450° C. When the output signal of the high frequency power supply is varied, the growth rate of the silicon oxynitride film being deposited on the silicon substrates 24 is changed and the composition of the resultant film is also changed to some degree. In the case where, instead of nitrous oxide, pure oxygen is used as the source of oxygen, the oxygen starts to react with the other reactive gases at the junction, or intermixing of these gases, and thus before the oxygen reaches the vicinity of the silicon substrates 24. Therefore, the use of pure oxygen is not preferred.

Figure 3:
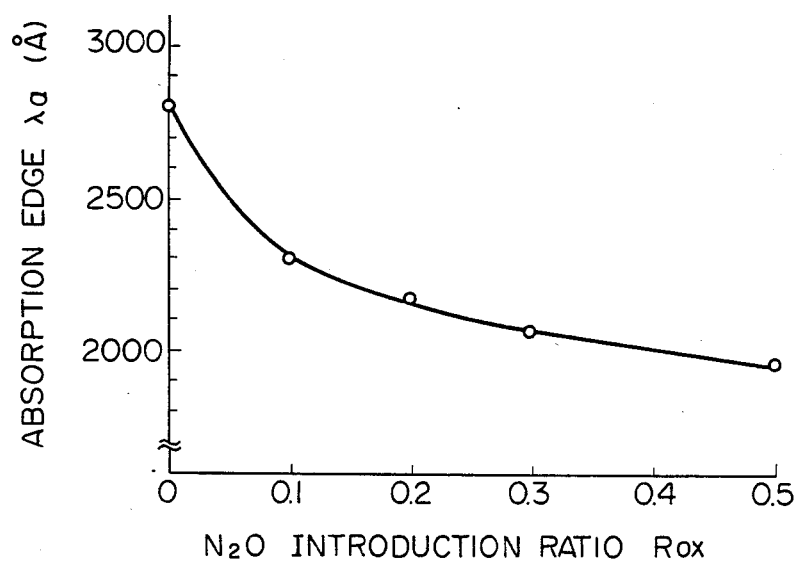
FIG. 3 is a graph showing a relationship between introduction ratio by volume of $N_2O$ used in forming a silicon oxynitride film and the absorption edge of the resulting films.

A silicon oxynitride film is deposited on the silicon substrates 24 by varying the ratio of $NH_3$ to $N_2O$ while maintaining the temperature within the reactive chamber, the pressure within the reactive chamber and the flow ratio of ($NH_3+H_2O$) to $SiH_4$ in the gaseous mixure at constant values of 350° C., 1.0 Torr and 10, respectively. The properties of the resultant silicon oxynitride films are shown in FIG. 3 and Tables 1 and 2.

TABLE 1

| Rox | 0 | 0.1 | 0.2 | 0.3 | 0.5 |
| --- | --- | --- | --- | --- | --- |
| λa (Å) | 2800 | 2300 | 2180 | 2060 | 1920 |
| Oxygen concentration in silicon nitride film (%) | 0 | 20 | 36 | 52 | 66 |

In Table 1, Rox represents an introduction ratio by volume of $N_2O$ which is defined by the formula: $N_2O/(NH_3+N_2O)$, λa represents an absorption edge which is defined by a wavelength of ultraviolet rays exhibiting a 10% transmission ratio through a 1 ($\mu$m) thick film. Table 1 shows a shift in the absorption edge λa (Å) of the resultant silicon oxynitride when the Rox is varied within the range of from 0 to 0.5.

It is apparent from FIG. 3 and Table 1 that as the Rox increases, i.e. the oxygen concentration in the silicon oxynitride film increases, the absorption edge λa of the film is shifted to a short wave length side, which results in a remarkable increase in the transmissivity of the film to ultraviolet rays. When the Rox is less than 0.1, i.e., the oxygen concentration in the film is less than 20%, the transmissivity of the film to ultraviolet rays is not increased to a substantial degree, i.e., it is substantially the same as that of a silicon nitride film.

TABLE 2

| Rox | 0 | 0.1 | 0.2 | 0.3 | 0.4 | 0.5 |
| --- | --- | --- | --- | --- | --- | --- |
| Resistance to cracking | x | o | o | o | o | o |

A one micron thick aluminum wiring layer was formed on an insulating layer covering a silicon substrate. A 7000 Å thick silicon oxynitride film was deposited on the aluminum wiring layer. The resistance to cracking of this oxynitride film was investigated.

Table 2 shows a relationship between the Rox and the resistance to cracking of the resultant film. The resistance to cracking was determined by heat treating the resultant film in an atmosphere consisting of 3% by volume of $H_2$ and the remainder of $N_2$, at a temperature of 450° C., for 30 minutes. The mark o indicates no generation of cracks, while the mark x indicates the generation of cracks. In general, the cracks occur in the form of a plurality of radial mustaches at a portion of the surface passivation film under which traces, or conductive leads formed from the wiring layer turn at an angle of 90°. It is considered that this occurrence of cracks is attributable to a strain, i.e., a relatively high tensile stress state, in the silicon nitride film. Oxygen is effective for reducing this strain in the silicon nitride film.

In the case where the Rox is more than 0.5, i.e. the oxygen concentration in the film is more than 66%, the composition of the resulting film approaches silicon dioxide which exhibits a poor moisture proofness. The reduction in moisture proofness is, however, negligible, when the oxygen concentration is 70% or lower. This result can be confirmed by an infrared spectrometer. That is, a PSG film is first deposited on a silicon substrate and a silicon oxynitride film is then deposited on the PSG film. The silicon substrate thus prepared is allowed to stand in an atmosphere containing a high moisture content at a high temperature. Then, the coated silicon substrate is removed from the above-mentioned atmosphere and irradiated with infrared rays. The intensity of the light transmitted through the substrate then is plotted versus the wave length of the infrared rays. The plotted data indicates that when the silicon oxynitride film is prepared at a Rox value of less than 0.5, an absorption due to the bond P=O of the PSG appears at a wave length of 1320 cm$^{-1}$. The plotted data also indicates that when the silicon oxynitride is prepared at a Rox value no less than 0.5, i.e., 0.5 or greater, this absorption decreases and finally disappears. This reduction in the above-mentioned absorption is attributable to the fact that the bond P=O is converted to a bond P—O—H, because the PSG film absorbs moisture through the silicon oxynitride film. In view of the above, it is preferable that the silicon oxynitride have an oxygen concentration of from 20 to 70%, i.e. it is prepared at a Rox value of from 0.1 to 0.5, and in terms of an absorption wave length, it exhibits a λa of from 1900 to 2300 Å.

The silicon oxynitride may be deposited by an atmospheric CVD method or a reduced pressure CVD method using a pressure of from 1 to 3 Torr. In this case, the deposition operation may be carried out under the same conditions as those used in the case of the plasma CVD method, except that instead of using the high frequency electric source, the interior of the reactive chamber is heated to a temperature of from 700° to 800° C. However, it is necessary to use a high melting point metal, such as titanium, in forming the source and drain electrodes 10 and 12.

In the case of using a reactive sputtering method, ions are sputtered toward a silicon target in an atmosphere consisting of argon (Ar), ammonia (NH$_3$) and oxygen (O$_2$) in the reactive chamber. In this case, the growth of silicon oxynitride is possible at a substrate temperature of 200° C. or lower.

As described above, in accordance with the present invention, by forming a surface passivation film, consisting of a silicon oxynitride film containing a small amount of oxygen, on the EPROM device, it is possible to increase the transmissivity to ultraviolet rays of the film without degrading the moisture proofness inherent in a silicon nitride film and to also enhance the resistance to cracking of the film when it is subjected to heat treatment. Accordingly, the silicon nitride film according to the present invention is very suitable as a surface passivation film for an EPROM device wherein information stored therein is to be erasable by ultraviolet rays.

We claim:

1. A semiconductor device comprising:
    a semiconductor substrate;
    at least one element selected from the class consisting of active and passive elements formed on or in said semiconductor substrate;
    a first insulating film formed on said semiconductor substrate;
    electrodes of said at least one element disposed on said substrate;
    a second insulating film formed on said substrate and covering said at least one element, said first insulating film and said electrodes, said second insulating film consisting of an oxynitride having an oxygen atom percentage, based on the total of the oxygen and nitrogen atoms of said oxynitride, in the range of from 20 to 70%, said second insulating film being permeable to ultraviolet rays;
    said device comprising an ultraviolet-erasable EPROM device wherein information stored therein is erasable by subjecting said device to irradiaton by ultraviolet rays; and
    means for permitting ultraviolet radiation to impinge on said EPROM device and to pass through second insulating film for selectively erasing information stored therein.

2. A semiconductor device according to claim 1, wherein said oxygen-containing silicon nitride film has a thickness of from about 0.5 to about 1.5 microns.

3. A semiconductor device as recited in claim 1 wherein said oxynitride is formed by a process employing a gaseous mixture including N$_2$O and NH$_3$ wherein the ratio of N$_2$O to NH$_3$+N$_2$O is in the rage of from about 0.1 to about 0.5.

4. A semiconductor device as recited in claim 3 wherein said process comprises a plasma chemical vapor deposition process in which monosilane is used as a feed gas, ammonia (NH$_3$) is used as a source of nitrogen and nitrous oxide (N$_2$O) is used as a source of oxygen, and wherein the ratio of N$_2$O to NH$_3$+N$_2$O is in a range of from about 0.1 to about 0.5.

5. A semiconductor device as recited in claim 4 wherein the plasma chemical vapor deposition process is carried out at a temperature of from 250° C. to 450° C.

6. A semiconductor device as recited in claim 3 wherein said process comprises a chemical vapor deposition process in which monosilane is used as a feed gas, ammonia (NH$_3$) is used as a source of nitrogen and nitrous oxide (N$_2$O) is used as a source of oxygen, and wherein the ratio of N$_2$O to NH$_3$+N$_2$O is in a range of from about 0.1 to about 0.5.

7. A semiconductor device as recited in claim 6 wherein the chemical vapor deposition process is carred out at a temperature of from 700° to 800° C.

8. A semiconductor device as recited in claim 3, wherein the process comprises a reactive sputtering process in which silicon is used as a target, ammonia (NH$_3$) or nitrogen (N$_2$) is used as a source of nitrogen and oxygen (O$_2$) or nitrous oxide (N$_2$O) is used as a source of oxygen.

* * * * *

UNITED STATES PATENT AND TRADEMARK OFFICE
CERTIFICATE OF CORRECTION

PATENT NO. : 4,581,622

DATED : April 8, 1986

INVENTOR(S) : Kanetake Takasaki et al.

It is certified that error appears in the above-identified patent and that said Letters Patent is hereby corrected as shown below:

Col. 1, line 41, "whle" should be --while--;

line 54, "and;" should be --and--.

Col. 2, line 8, "and;" should be --and--;

line 9, after "between" insert --the--;

line 22, "semicondcutor" should be --semiconductor--;.

Col. 3, line 24, "plasuma" shuld be --plasma--.

Col. 5, line 41 (line numbering off), "to also" should be --also to--.

Col. 6, line 16, "irradiaton" should be --irradiation--;

line 27, "rage" should be --range--;

line 47, "carred" should be --carried--.

Signed and Sealed this

Twenty-second Day of July 1986

[SEAL]

Attest:

DONALD J. QUIGG

Attesting Officer    Commissioner of Patents and Trademarks